United States Patent [19]
Yamashita et al.

[11] Patent Number: 4,532,632
[45] Date of Patent: Jul. 30, 1985

[54] TUNABLE SEMICONDUCTOR LASER

[75] Inventors: Tsukasa Yamashita, Nara; Kazuhiko Mori, Osaka; Masaharu Matano, Kyoto; Norihiro Ota, Saitama, all of Japan

[73] Assignee: Omron Tateisi Electronics Co., Kyoto, Japan

[21] Appl. No.: 403,819

[22] Filed: Jul. 30, 1982

[30] Foreign Application Priority Data

Jul. 31, 1981 [JP] Japan ................ 56-120852

[51] Int. Cl.³ ................ H01S 3/19
[52] U.S. Cl. ................ 372/50; 350/358; 350/96.13; 372/20; 372/96
[58] Field of Search ........ 372/50, 20, 92, 96, 372/98, 99; 350/358, 96.13, 96.12, 96.14, 96.11

[56] References Cited

U.S. PATENT DOCUMENTS

| | | | |
|---|---|---|---|
| 3,755,671 | 8/1973 | Lockwood | 372/50 |
| 4,039,249 | 8/1977 | Kaminow et al. | 350/96.11 |
| 4,216,440 | 8/1980 | Rahn et al. | 372/20 |
| 4,286,838 | 9/1981 | Huignard et al. | 372/50 |
| 4,318,058 | 3/1982 | Mito et al. | 372/50 |
| 4,327,962 | 5/1982 | Redman | 350/96.15 |
| 4,390,236 | 6/1983 | Alferness | 350/96.14 |

FOREIGN PATENT DOCUMENTS

0014392 2/1977 Japan ................ 372/96

OTHER PUBLICATIONS

Burnham et al., "Achieving Efficient SMG in Thin Film Waveguides by Adjusting Waveguide Properties Retractive Index", *Xerox Disclosure Journal*, vol. 4, No. 3, pp. 347-348, May/Jun. '79.
Stern, "Standing-Wave Acoustic Modulation of Semiconductor Lasers", *IBM Technical Disclosure Bulletin*, vol. 13, No. 6, Nov. 1970, pp. 1646-1647.
Harris et al., "Internal Modulation of Injection Lasers Using Acoustic Waves", *IBM Technical Disclosure Bulletin*, vol. 13, No. 12, May 1971, p. 3871.
Lee et al., "Integration of an Injection Laser with a Gunn Oscillator on a Semi-Insulating GaAs Substrate", *Appl. Phys. Lett.* 32(12), Jun. 15, 1978, pp. 806–807.
H. Kawanishi, Japan J. Appl. Phys., vol. 17, (1978), No. 8, $Ga_xIn_{1-x}AS_yP_{1-y}$-InP Injection Laser Partially Loaded with Distributed Bragg Reflector.
M. Yamanishi, Optically Pumped GaAs Lasers with Acoustic Distributed Feedback, Appl. Phys. Lett. 33(3), Aug. 1, 1978.
K. Aiki, A Frequency-Multiplexing Light Source with Monolithically Integrated Distributed-Feedback Diode Lasers, IEEE Jour. of Quantum Elec., vol. QE-13, No. 4, Apr. 1977.
Lee and Fong, Electromagnetic Wave Scattering from an Active Corrugated Structure, J. Appl. Phys., vol. 43, No. 2, Feb. 1972.
Cho and Matsuo, Electrooptic-Distributed Bragg-Reflection Modulators for Integrated Optics, IEEE Jour. of Quantum Elec., vol. QE-13, No. 4, Apr. '77.

*Primary Examiner*—James W. Davie
*Attorney, Agent, or Firm*—Cushman, Darby & Cushman

[57] ABSTRACT

A tunable semiconductor laser has an active layer, an insulating film made of a piezoelectric material and formed on a portion of the active layer, and an interdigital transducer provided on the insulating film for generating a surface acoustic wave. The laser oscillation wavelength is variable by varying the wavelength of the surface acoustic wave generated by the transducer. When adapted to produce surface acoustic waves of different frequencies at different locations, the transducer affords an enlarged tunable wavelength band. A plurality of Gunn diodes effecting oscillation at different frequencies are usable in place of the transducer.

13 Claims, 12 Drawing Figures

TUNABLE SEMICONDUCTOR LASER

BACKGROUND OF THE INVENTION

The present invention relates to a tunable semiconductor laser adapted for laser oscillation at an optionally variable wavelength.

A GaAs-Ga$_{1-x}$Al$_x$As double heterostructure distributed feedback laser diode is known as one of semiconductor lasers for effecting single longitudinal mode oscillation developed for long-distance optical transmission. The laser diode includes an active layer formed with a grating provided by a multiplicity of parallel grooves at a given spacing. The laser diode effects stable oscillation at a selected wavelength λ given by the following equation.

$$\lambda = 2n\Lambda/m \tag{1}$$

where n is the refractive index of the active layer, Λ is the spacing between the grooves of the grating, and m is the order of the Bragg diffraction. Equation (1) indicates that the wavelength λ of the laser beam emitted is dependent on the spacing Λ of the grating, hence stable oscillation, whereas the diode involves the problem that the oscillation wavelength can not be altered. The laser diode may be made wavelength-tunable by utilizing the fact that the refractive index n varies with temperature, but to vary the temperature over a wide range requires a heating or cooling device, while there aries the need to use a constant-temperature chamber or thermostat to maintain the diode at the desired temperature stably. The use of such a device is undesirable when providing the diode in the form of an integrated unit including an optical circuit and other elements. Further because the Ga$_{1-x}$Al$_x$As cladding layer must be grown after forming the grating on the active layer, the diode is difficult to fabricate and likely to involve defects at the junction of the active layer and the cladding layer.

SUMMARY OF THE INVENTION

An object of the present invention is to provide a tunable semiconductor laser which is adapted for stable single longitudinal mode oscillation and with which the oscillation wavelength is variable over a wide range.

Another object of the invention is to provide a tunable semiconductor laser which can be integrated with an optical circuit and other elements and which is easy to fabricate.

The tunable semiconductor laser of this invention has an active layer and means for selectively reflecting light of a specified wavelength emitted within the active layer, the reflecting means being capable of varying the wavelength of the light to be reflected and being provided on or above a portion of the active layer. Examples of useful light reflecting means are means for generating a surface acoustic wave (hereinafter referred to as "SAW") having a variable frequency, such as an interdigital transducer (hereinafter referred to as "IDT"), and means for generating SAW's of different frequencies at different locations, such as an IDT having linear electrodes at different spacings, or a plurality of Gunn diodes which are different in the spacing between the electrodes and therefore adapted for oscillation at different frequencies. Other examples of light reflecting means will be described with reference to embodiments.

The presence of the SAW produces on the active layer distributions of refractive indexes repeating at a specified spacing, and only the light of wavelength which is determined by the spacing of the distributions is reflected selectively, so that laser oscillation occurs at the single wavelength selected. Since the frequency of the SAW is tunable and differs from location to location, a laser beam of the desired wavelength can be obtained. Because the IDT or Gunn diodes only need to be provided on or above the active layer of the semiconductor laser, the present laser is easy to fabricate and can be provided in the form of an integrated unit.

Other features and advantages of the invention will become apparent from the following description of embodiments with reference to the accompanying drawings.

DESCRIPTION OF THE PREFERRED EMBODIMENTS

Figure 1:
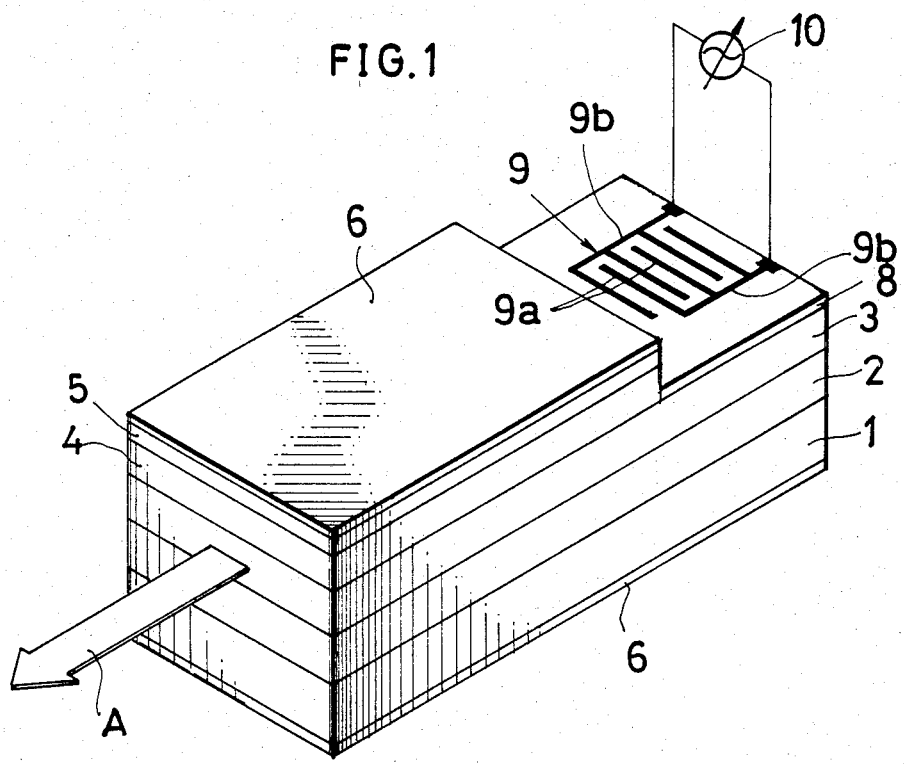
FIG. 1 is a perspective view schematically showing an embodiment of the invention.

FIG. 1 shows a double heterostructure (DH structure) laser embodying the invention. As is well known, the DH structure laser is prepared by growing on an n-GaAs single-crystal substrate 1 an n-Ga$_{1-x}$Al$_x$As cladding layer 2, a p-GaAs layer 3 serving as an active region, p-Ga$_{1-x}$Al$_x$As cladding layer 4 and a p-GaAs layer 5 by the liquid phase epitaxy technique, forming contacts 6 on the upper and lower surfaces of the resulting structure by vacuum evaporation, and cleaving or cutting the structure to a suitable size. With this laser diode, the cleaved facets at the opposite ends provide an optical resonator, so that when a forward current is passed through the diode and exceeds a threshold value, the p-GaAs layer 3 serves as an active layer for confining light and carriers therein to emit a laser beam A.

A portion of the DH structure is cut out as by etching to partly expose the p-GaAs layer 3. An insulating film 8 of a piezoelectric material, such as ZnO, is formed on the exposed portion of the layer 3, and an IDT 9 is provided on the film 8, for example, by photolithography.

A high-frequency electric field is applied to the IDT 9 by a frequency-variable oscillator 10. This generates from the IDT 9 a SAW which propagates on the insulating film 8 in the direction of emission of the laser beam A. The SAW gives the insulating film 8 distributions of refractive indexes repeating at a specified spacing in the direction of propagation of the beam. Only the light of a wavelength determined by the spacing of the distributions is reflected, with the result that single mode longitudinal laser oscillation occurs at the selected wavelength. Assuming that the wavelength of the SAW is Λ, a laser beam is obtained which has a wavelength λ given by Equation (1). Moreover, the wavelength Λ of the SAW is variable by varying the frequency of the electric field to be applied to the IDT 9, so that the wavelength to be selected is also variable.

It is assumed that the frequency f of the electric field to be applied to the IDT 9 is varied by Δf to produce a variation ΔΛ in the wavelength Λ of the SAW. From Equation (1), the resulting variation Δλ of the oscillation wavelength λ is $$\Delta\lambda = 2n\Delta\Lambda/m \qquad (2)$$

When the velocity of propagation of the SAW is V, $$V = f\Lambda \qquad (3)$$

Therefore $$\Delta f = \Delta\Lambda(-f^2/V) \qquad (4)$$

From Equations (4) and (2)

$$\Delta\lambda = -2nV(\Delta f/f^2 m) \qquad (5)$$

For example when m is 1, V is 3300 m/s, n is 3.37, f is 20 GHz and Δf is 2 GHz in Equation (4),
Δλ = 0.11 μm
Suppose the IDT 9 has an oscillation frequency of 20 GHz to give a laser beam having a wavelength of 1 μm. If the frequency is then varied by 2 GHz, the wavelength of the laser beam varies by 0.11 μm = 1100 Å.

Figure 2:
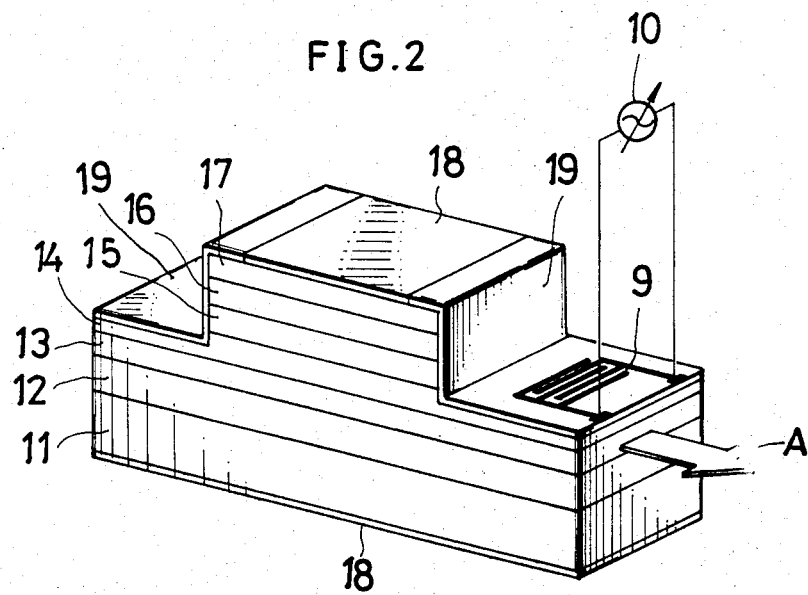
FIG. 2 is a perspective view schematically showing another embodiment of the invention.

FIG. 2 shows an integrated twin guide (ITG) type laser diode embodying the invention. The diode comprises $Ga_{1-x}Al_xAs$ cladding layers 12, 14 and 16, GaAs layers 13 and 15 serving as active layers, and a p-GaAs layer 17 which are formed over an n-GaAs substrate 11. Contacts 18 are formed on the upper and lower surfaces of the structure by vacuum evaporation. At each end of the laser, the cladding layer 14 and the overlying layers are cut out, and the exposed portion is covered with an insulating film 19. At least one of the two portions of the films 19 parallel to the GaAs layer 13 is provided with an IDT 9. Like the DH structure laser shown in FIG. 1, the ITG type laser is wavelength-tunable by varying the frequency of the driving electric field to be applied to the IDT 9.

Figure 3:
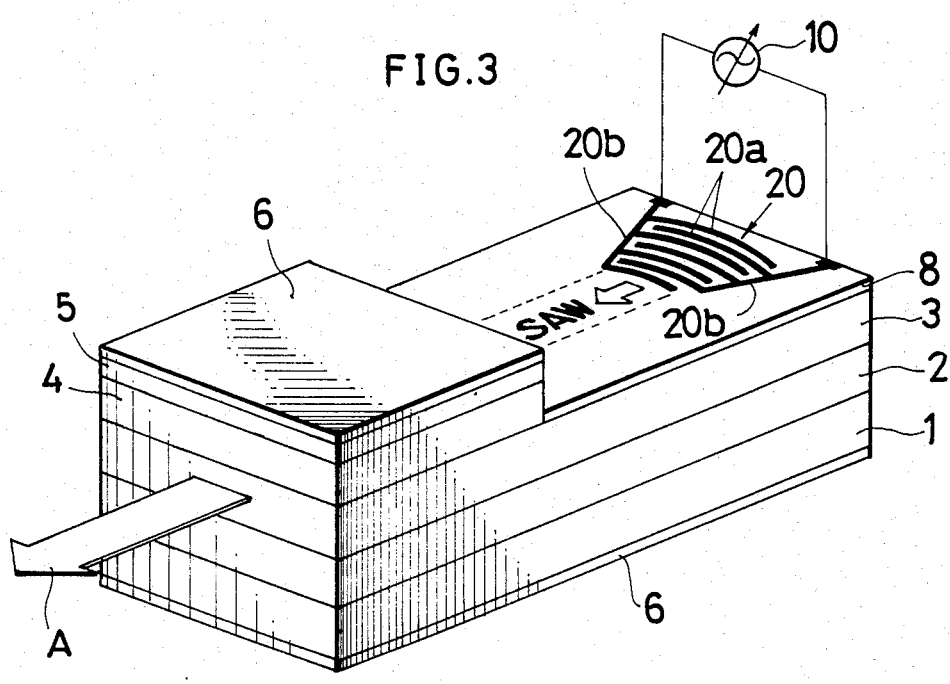
FIG. 3 is a perspective view schematically showing a modification of the embodiment of FIG. 1.

FIG. 3 shows a modified DH structure laser embodying the invention and having an IDT 20 which differs from the IDT shown in FIG. 1 in configuration. The IDT 9 comprises a large number of parallel linear electrodes 9a, and two parallel common electrodes 9b connecting every other electrode 9a. The IDT 20 comprises linear electrodes 20a each in the form of a circular arc, and common electrodes 20b which are not in parallel but are inclined toward each other. The circular arc arrangement of the linear electrodes 20a of the IDT serves to inhibit the spreading out of the oscillation mode and the laser beam to be emitted.

Figure 4:
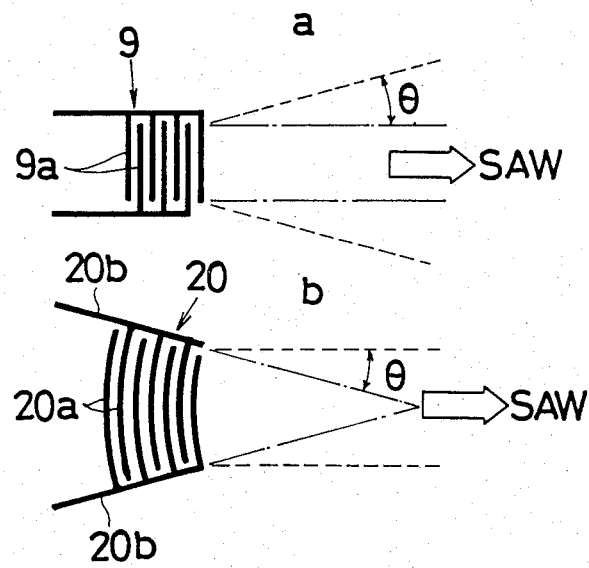
FIG. 4 shows how a SAW spreads out.

With the IDT 9 shown in FIG. 4, section a and having straight linear electrodes 9a, the SAW generated propagates while spreading out through an angle θ due to a diffraction effect, consequently causing spreading out of the laser oscillation mode or laser beam. However, with the IDT 20 shown in FIG. 4, section b and having the circular arc linear electrodes 20a, the SAW propagates in a converging direction, consequently propagating substantially without spreading out even if the spreading angle θ is considered. This inhibits spreading out of the laser beam A and results in a stable oscillation mode. The light can be confined effectively to assure an improved laser oscillation efficiency, reducing the power needed for the high-frequency electric field to be applied to the IDT 20.

Figure 5:
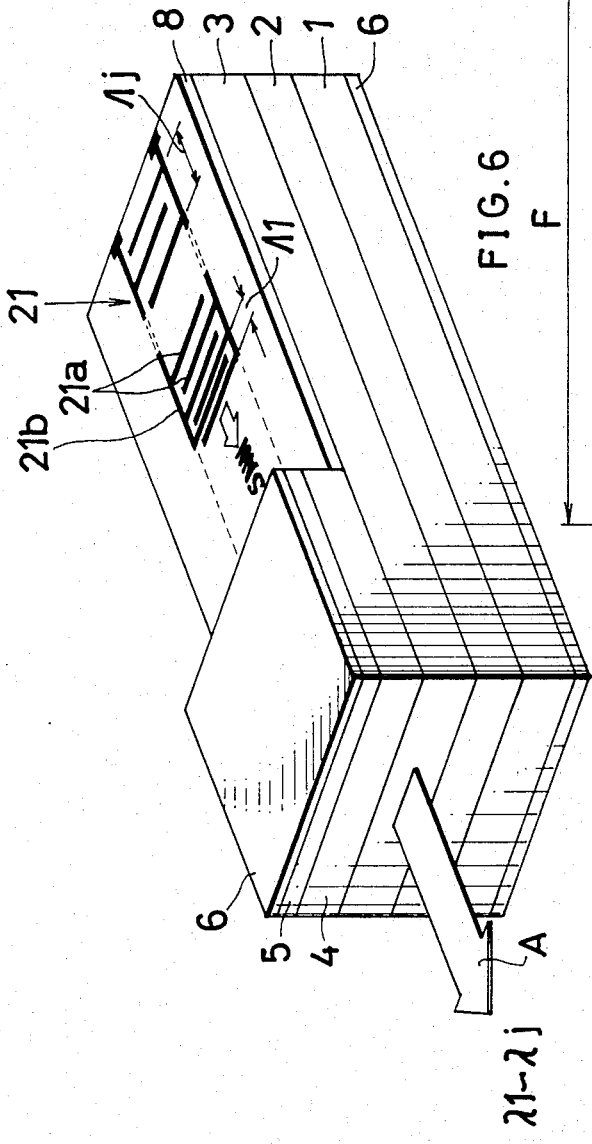
FIG. 5 is a perspective view schematically showing another modification.
Figure 6:
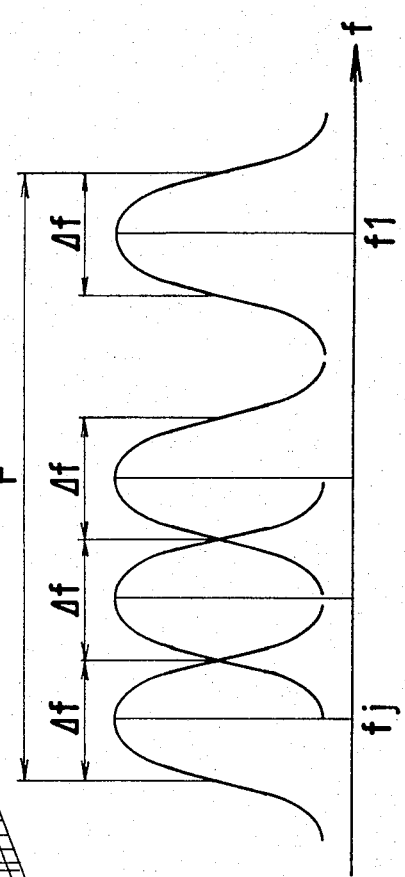
FIG. 6 shows an enlarged oscillation frequency bandwidth.

FIG. 5 shows another modification. An IDT 21 provided on an insulating film 8 comprises straight electrodes 21a, and the pitch (the spacing between the adjacent electrodes 21a connected to each common electrode 21b) is varied in the direction of propagation of the SAW produced. When the pitch of all the linear electrodes 9a is the same as is the case with the IDT 9 shown in FIG. 1, the tunable wavelength band is limited to a narrow range since the center wavelength of the SAW is dependent on the pitch. In the case of the IDT 21 shown in FIG. 5, however, the spacings between the electrodes 21a connected to the same electrode 21b are different in corresponding relation to the different wavelengths Λ1 to Λj of the SAW. Accordingly the wavelength of the SAW to be generated from the IDT 21 can be varied by ΔΛ as centered at each of the wavelengths Λ1 to Λj. When this is expressed in terms of the frequency f of the electric field to be applied to the IDT 21, with the frequencies corresponding to the wavelengths Λ1 to Λj represented by f1 to fj, the frequency can be varied by Δf as centered at each of the frequencies f1 to fj. Thus, when the pitches Λ1 to Λj are suitably determined, the bandwidth F of tunable frequencies is j times the bandwidth F in the case where the pitches are equal, namely F = j·Δf, as illustrated in FIG. 6. It therefore follows that when the oscillation wavelengths of the DH structure laser are λ1 to λj in corresponding relation to the frequencies f1 to fj, the laser oscillation wavelength can be varied by Δλ of Equation (5) as centered at each of λ1 to λj. Thus the oscillation wavelength of the tunable semiconductor laser is variable over the wide range of j·Δλ.

Figure 7:
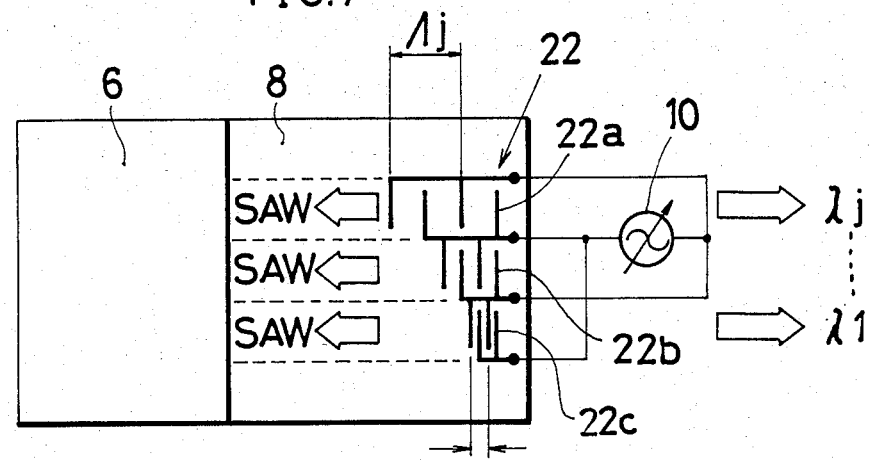
FIGS. 7 to 9 are plan views showing other modifications.

FIG. 7 shows another modification, wherein linear electrodes 22a to 22c having different pitches are arranged in a direction at right angles to the direction of emission of the laser beam to provide an IDT 22. The laser produces beams having different wavelengths λ1 to λj (j = 3) at different beam emitting positions.

Figure 8:
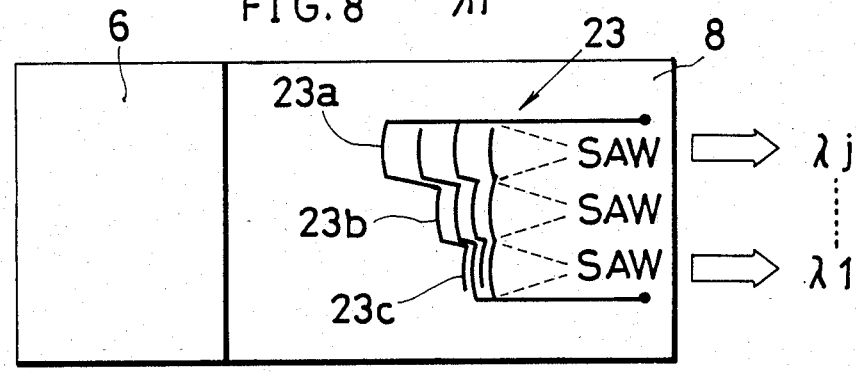

FIG. 8 shows another modification, wherein three kinds of circular-arc linear electrodes 23a to 23c, different in pitch, provide an IDT 23. The electrodes are connected together. Since the SAW's generated from such circular-arc linear electrodes tend to converge as already stated, the laser beam emitted is prevented from spreading out.

Figure 9:
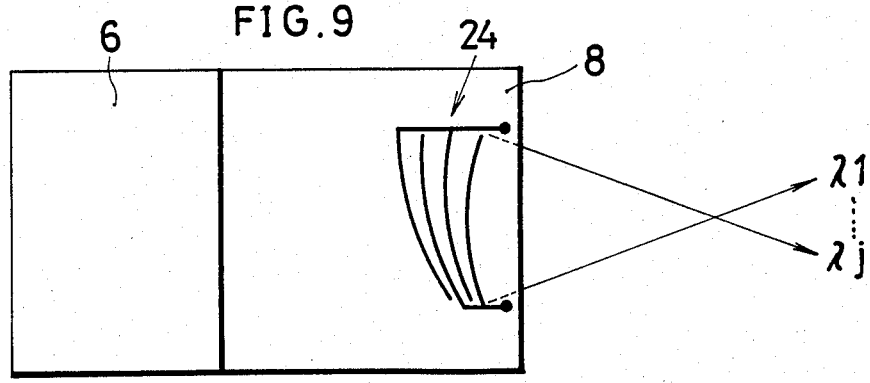

FIG. 9 shows still another modification, wherein an IDT 24 comprises circular-arc linear electrodes having a continuously varying pitch. In this case, the wavelength of the laser beam emitted varies with the position of emission, and the beam converges at a point. This faciliates optical coupling, for example, to an optical fiber.

With the modifications of FIGS. 5 and 7 to 9, d.c. voltage can be applied to the IDT because distributions of refractive indexes are then produced immediately therebelow.

Figure 10:
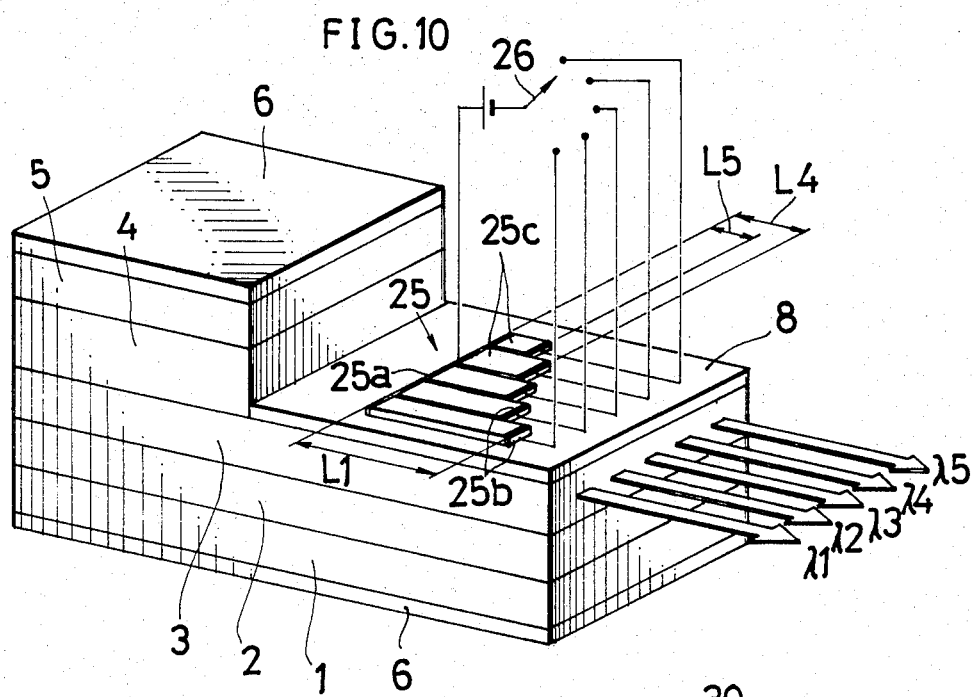
FIG. 10 is a perspective view schematically showing another embodiment of the invention.

FIG. 10 shows another embodiment. The DH structure laser shown is provided with an array 25 of Gunn diodes 25c formed on an insulating film 8 and arranged as insulated from each other in a row at right angles to the direction of emission of a laser beam. The spacing between electrodes 25a and 25b differ from diode to diode. One of the Gunn diodes 25c of the array 25 is selectively driven by a change-over switch 26 to generate from the selected Gunn diode a SAW propagating on the film 8 in the direction of emission. As already stated, single mode laser oscillation occurs at a wavelength selected in accordance with the wavelength of the SAW. The wavelength of the SAW is selectively determined by selectively driving one of the Gunn diodes which differ in the spacing of the electrodes to thereby change the oscillation wavelength. Of course, all the Gunn diodes can be driven at the same time.

Generally the Gunn diodes effects oscillation at a frequency f expressed by $$f = V_d/L \qquad (6)$$

wherein $V_d$ is the drift velocity of electrons (about $10^7$ cm/sec), and L is the electrode spacing of the Gunn. For example, if L is 10 μm, f is 10 GHz. Since the Gunn diodes 25c of the array 25 have different spacings of L1 to L5 between the electrodes 25a and 25b, one of the Gunn diodes, when selected for oscillation, propagates a SAW having a frequency given by Equation (6) with use of the spacing concerned. When the period of the SAW is Λ, the laser oscillation wavelength λ is expressed by Equation (1). Thus the laser oscillation occurs at one of the wavelengths λ1 to λ5 corresponding to the electrode spacing of the Gunn diode driven.

Figure 11:
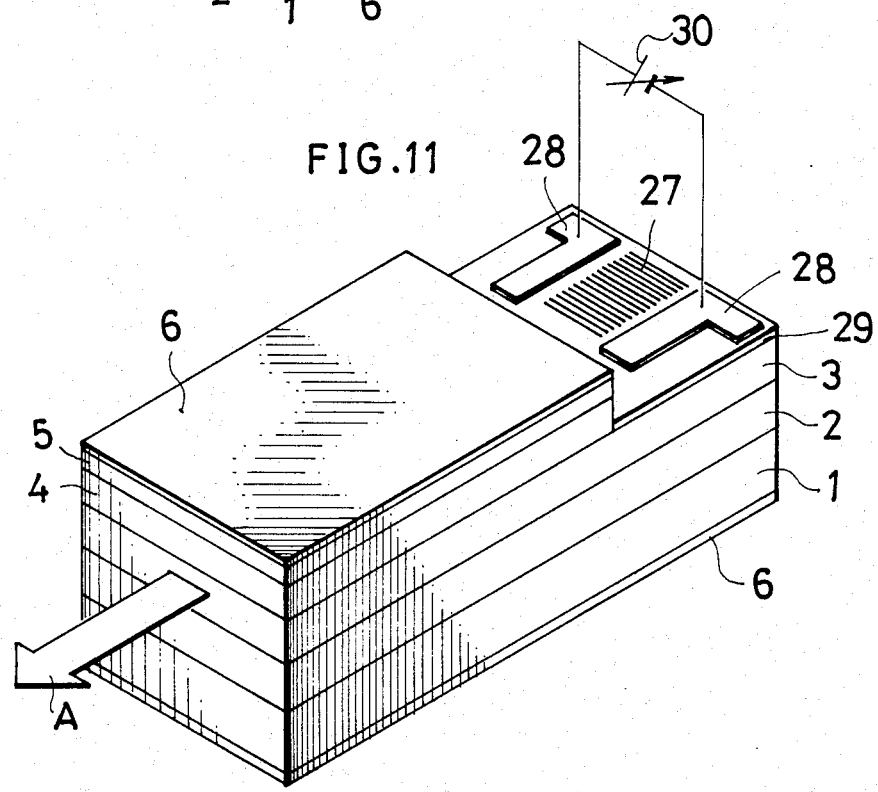
FIG. 11 is a perspective view schematically showing another embodiment of the invention.

FIG. 11 shows still another embodiment. The DH structure laser includes an active layer 3, and a film 29 of a material producing an electro-optical effect, e.g. BaTiO$_3$, is formed on an exposed portion of the layer 3. A periodic grating 27 is formed on the film 29, for example, by the combination of electron beam exposure or holographic exposure and ion beam etching technique. Opposed electrodes 28 are provided on the BaTiO$_3$ film 29 on the opposite sides of the grating 27.

When d.c. voltage or a.c. voltage is applied across the electrodes by a power source 30, the resulting electro-optical effect varies the refractive index n of the film 29 provided with the grating 27 to vary the oscillation wavelength. Assuming that the voltage is E, the distance between the electrodes 28 is d, and the electro-optical constant of the film 29 is γ, the variation Δn of the refractive index is expressed by $$\Delta \propto \gamma n^3 E/d \qquad (7)$$

Accordingly the variation Δλ of the laser oscillation wavelength is given by Equation (1) as follows.

$$\Delta\lambda = 2\Delta n \Lambda/m \propto 2\gamma n^3 E\Lambda/dm \qquad (8)$$

Thus if the voltage E is varied, the laser oscillation wavelength can be varied by Δλ. Since BaTiO$_3$ has a great electro-optical constant ($\gamma_{42} = 8.2 \times 10^{-10}$ m/V), use of this material produces great variations in the refractive index to enlarge the bandwidth of tunable wavelengths.

While the embodiments of FIGS. 3 to 11 are DH structure lasers embodying the invention, the invention is of course applicable to semiconductor lasers of other types.

Figure 12:
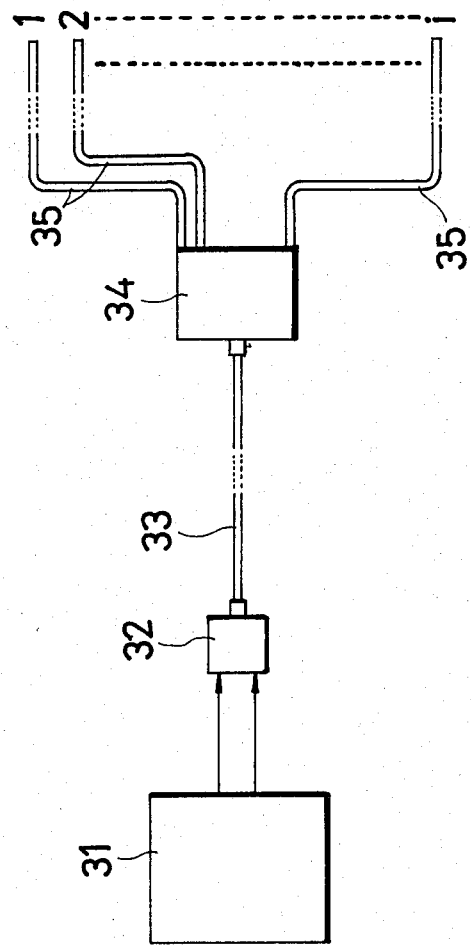
FIG. 12 is a block diagram showing a wavelength multiplex communication system.

The tunable semiconductor laser of the invention is advantageously usable for wavelength multiplex communication. With reference to FIG. 12, laser beam signals having different wavelengths are delivered from a tunable semiconductor laser 32 of the invention to a light wave branching unit 34 via an optical fiber 33 in response to control signals from a central processing unit 31. The branching unit 34 is connected to optical fibers 35 for channels 1, 2, . . . i. The laser beam signals of varying wavelengths are delivered to the optical fibers 35 by real-time transmission upon switching. The tunable semiconductor laser of the invention, even if used singly, gives laser beam signals of different wavelengths in response to control signals and therefore affords a wavelength multiplex communication system of simple construction.

What is claimed is:

1. In a tunable semiconductor laser having an active layer, the laser comprising:
   an insulating film made of piezoelectric material formed above a portion of the active layer; and
   means for selectively reflecting light of a specified wavelength emitted within the active layer, the reflecting means being capable of varying the wavelength of the light to be reflected and being provided on the insulating film.

2. In a tunable semiconductor laser as defined in claim 1 wherein the light reflecting means comprises means for generating a surface acoustic wave having a variable frequency.

3. In a tunable semiconductor laser as defined in claim 1 wherein the light reflecting means comprises means for generating surface acoustic waves of different frequencies at different locations, each of the surface acoustic waves having a variable frequency.

4. In a tunable semiconductor laser as defined in claim 1 wherein the light reflecting means comprises an interdigital transducer for generating a surface acoustic wave of variable frequency.

5. In a tunable semiconductor laser as defined in claim 1 wherein the light reflecting means comprises an interdigital transducer for generating surface acoustic waves of different frequencies at different locations, each of the surface acoustic waves having a variable frequency.

6. In a tunable semiconductor laser as defined in any one of claims 4 or 5 wherein the interdigital transducer is driven by a frequency-variable high-frequency oscillator.

7. In a tunable semiconductor laser as defined in claim 1 wherein the light reflecting means comprises a plurality of Gunn diodes each of which has a pair of electrodes at opposite sides thereof and wherein the spacing between the electrodes of the Gunn diodes are different from each other to effect oscillation at different frequencies.

8. In a tunable semiconductor laser as defined in claim 1 wherein the light reflecting means comprises a grating and a pair of electrodes provided on the opposite sides of the grating.

9. In a tunable semiconductor laser as defined in claim 5 wherein the interdigital transducer includes a plurality of linear electrodes, and the linear electrodes are each in the form of a circular arc to inhibit spreading out of the surface acoustic wave to be generated and propagated.

10. In a tunable semiconductor laser as defined in claim 9 wherein the interdigital transducer includes a plurality of linear electrodes, and the pitch of the linear electrodes differs from location to location.

11. In a tunable semiconductor laser as defined in claim 7 which is provided with means for selectively driving the plurality of Gunn diodes.

12. In a tunable semiconductor laser as defined in claim 8 which is provided with a power source for applying d.c. or a.c. voltage across the pair of electrodes.

13. In a tunable semiconductor laser having an active layer, the laser comprising:
- an insulating film made of piezoelectric material formed above a portion of the active layer; and
- light reflecting means comprising a plurality of interdigital transducers being provided on the insulating film and being driven by a d.c. power source.

* * * * *